United States Patent
Jin

(10) Patent No.: US 10,828,871 B2
(45) Date of Patent: *Nov. 10, 2020

(54) CARRIER SUBSTRATE AND METHOD OF MANUFACTURING SEMICONDUCTOR PACKAGE USING THE SAME

(71) Applicant: SAMSUNG ELECTRONICS CO., LTD., Suwon-si (KR)

(72) Inventor: Han Na Jin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 127 days.

This patent is subject to a terminal disclaimer.

(21) Appl. No.: 16/157,701

(22) Filed: Oct. 11, 2018

(65) Prior Publication Data

US 2019/0366690 A1  Dec. 5, 2019

(30) Foreign Application Priority Data

May 29, 2018  (KR) .................. 10-2018-0061126

(51) Int. Cl.
| | | |
|---|---|---|
| *B32B 3/00* | (2006.01) | |
| *B32B 17/06* | (2006.01) | |
| *H05K 3/38* | (2006.01) | |
| *H05K 1/09* | (2006.01) | |
| *H05K 3/28* | (2006.01) | |
| *H05K 1/03* | (2006.01) | |
| *H05K 3/06* | (2006.01) | |

(52) U.S. Cl.
CPC ........... *B32B 17/06* (2013.01); *H05K 1/0306* (2013.01); *H05K 1/09* (2013.01); *H05K 3/06* (2013.01); *H05K 3/28* (2013.01); *H05K 3/388* (2013.01)

(58) Field of Classification Search
CPC .......... H05K 1/0306; H05K 1/09; H05K 3/06; H05K 3/28; H05K 3/388; B27B 7/06; B27B 17/06

See application file for complete search history.

(56) References Cited

U.S. PATENT DOCUMENTS

| | | |
|---|---|---|
| 2007/0243404 A1 | 10/2007 | Lin |
| 2015/0156877 A1 | 6/2015 | Kang et al. |
| 2016/0056102 A1 | 2/2016 | Konchady et al. |
| 2017/0207156 A1 | 7/2017 | Wang |

FOREIGN PATENT DOCUMENTS

| | | |
|---|---|---|
| JP | 2015-063096 A | 4/2015 |
| JP | 2018-029184 A | 2/2018 |
| KR | 10-2013-0008487 A | 1/2013 |
| KR | 10-2015-0062556 A | 6/2015 |
| KR | 10-2016-0060937 A | 5/2016 |

OTHER PUBLICATIONS

Communication dated Aug. 16, 2019, issued by the Korean Intellectual Property Office in counterpart Korean Patent Application No. 10-2018-0061126.
Communication dated Feb. 19, 2020, issued by the Taiwan Patent Office in counterpart Taiwan Application No. 107135582.

*Primary Examiner* — Elizabeth E Mulvaney
(74) *Attorney, Agent, or Firm* — Sughrue Mion, PLLC

(57) ABSTRACT

A carrier substrate includes a core layer, a first metal layer disposed on the core layer, and a plurality of unit pattern portions disposed on the first metal layer. The plurality of unit pattern portions each have a planar area smaller than a planar area of the first metal layer. The plurality of unit pattern portions each include a second metal layer disposed on the first metal layer, a release layer disposed on the second metal layer, and a third metal layer disposed on the release layer.

20 Claims, 15 Drawing Sheets

CARRIER SUBSTRATE AND METHOD OF MANUFACTURING SEMICONDUCTOR PACKAGE USING THE SAME

CROSS-REFERENCE TO RELATED APPLICATION(S)

This application claims the benefit of priority to Korean Patent Application No. 10-2018-0061126 filed on May 29, 2018 in the Korean Intellectual Property Office, the disclosure of which is incorporated herein by reference in its entirety.

TECHNICAL FIELD

The present disclosure relates to a semiconductor package including an organic interposer.

BACKGROUND

The interposer market is increasingly growing, with high-specification sets and the employment of high bandwidth memory (HBM). Silicon (Si) is a main material of interposer at present, but methods of utilizing glass or organic materials are being developed to realize large size and low cost interposers.

To satisfy recent demand for a fine pad pitch of several micrometers, a die-to-die fine circuit line is required to be miniaturized by up to several micrometers. A carrier having flatness secured therein, as compared with a conventional carrier, is required to implement such a fine circuit.

A process of fabricating a semiconductor package including an interposer using a carrier is performed, for example, in quad size, in order to improve the quality of a package process after an interposer is formed in panel size. The carrier may be separated while cutting a panel into a quad size. Accordingly, a separation prevention design is demanded to prevent separation of the carrier.

SUMMARY

An aspect of the present disclosure is to provide a novel type of carrier substrate into which a separation prevention design is introduced, and a method of manufacturing the carrier substrate.

An aspect of the present disclosure is to detachably introduce a metal layer and a release layer to a core layer, formed of a material such as glass. Portions of the metal layer and the release layer may be patterned to have a smaller area than that of the core layer.

According to an aspect of the present disclosure, a carrier substrate includes a core layer; a first metal layer disposed on the core layer; and a plurality of unit pattern portions disposed on the first metal layer. The plurality of unit pattern portions each have a planar area smaller than a planar area of the first metal layer. The plurality of unit pattern portions each include a second metal layer disposed on the first metal layer, a release layer disposed on the second metal layer, and a third metal layer disposed on the release layer.

According to an aspect of the present disclosure, a method of manufacturing a semiconductor package includes preparing a carrier substrate including a core layer, a first metal layer disposed on the core layer, and a plurality of unit pattern portions disposed on the first metal layer, each of the plurality of unit pattern portions having a planar area smaller than a planar area of the first metal layer, and the plurality of unit pattern portions each including a second metal layer disposed on the first metal layer, a release layer disposed on the second metal layer, and a third metal layer disposed on the release layer; forming an interposer on the respective unit pattern portions; cutting the carrier substrate and the interposer to disconnect the respective unit pattern portions from each other; placing a plurality of semiconductor chips on the respective disconnected unit pattern portions; forming an encapsulant on the interposer on the respective disconnected unit pattern portions to form a plurality of semiconductor packages on the respective disconnected unit pattern portions, the encapsulant encapsulating the respective semiconductor chips, and the plurality of semiconductor packages each including an interposer portion, one or more semiconductor chips disposed on the interposer portion, and an encapsulation portion disposed to encapsulate the one or more semiconductor chips; trimming the respective disconnected unit pattern portions to disconnect the plurality of semiconductor packages on the respective disconnected unit pattern portions from each other; and separating the carrier substrate from the respective disconnected semiconductor packages.

According to another aspect of the present disclosure, a carrier substrate includes a core layer; a first metal layer disposed on the core layer; a plurality of unit pattern portions, disposed on the first metal layer, comprising at least one metal layer and at least one release layer; and an insulating layer covering the plurality of unit pattern portions. The plurality of unit pattern portions each have a planar area smaller than a planar area of the first metal layer. The insulating layer is separated from the core layer with the first metal layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Electronic Device

Figure 1:
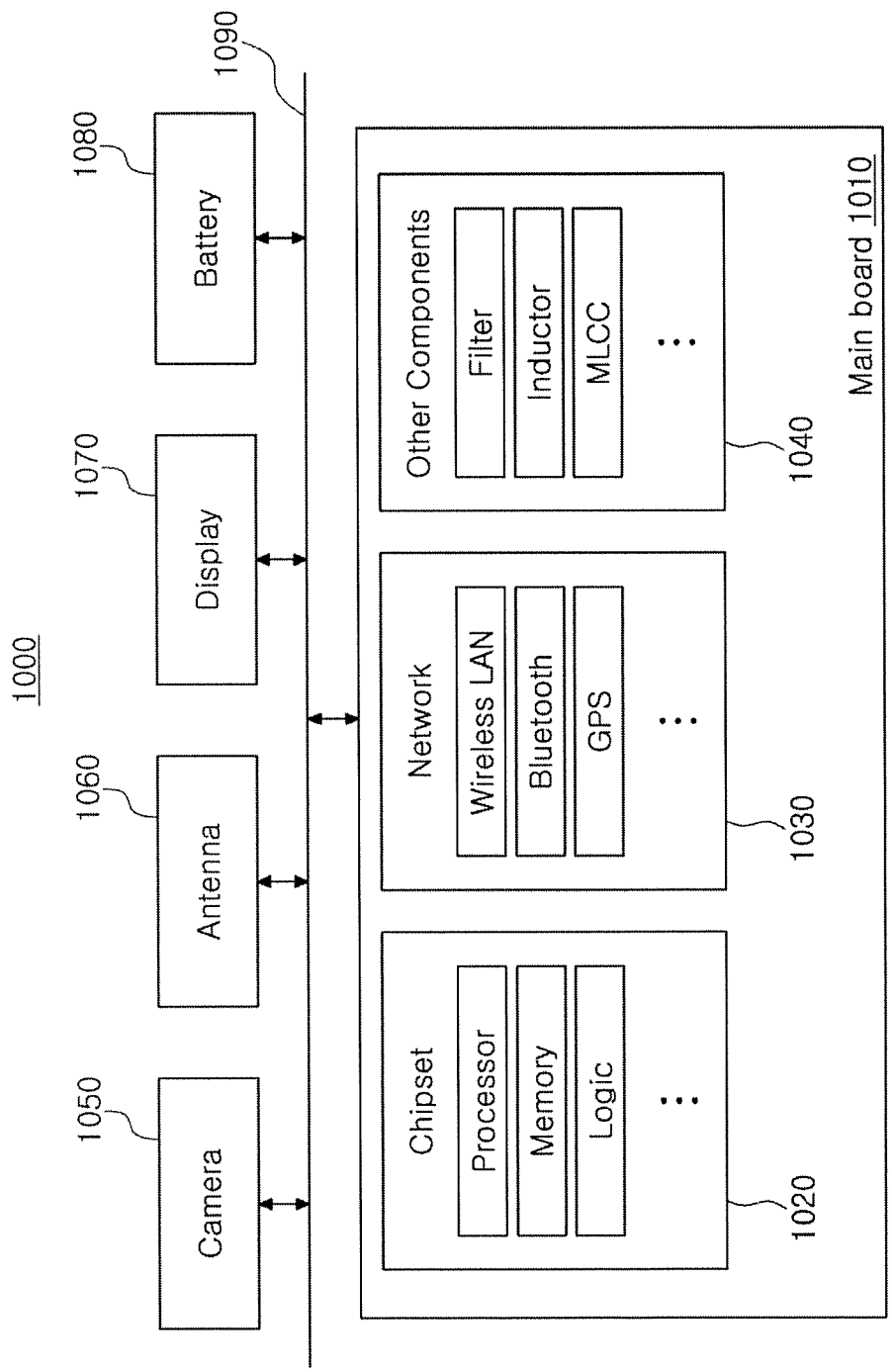
FIG. 1 is a block diagram illustrating an exemplary embodiment of an electronic device system.

FIG. 1 is a block diagram illustrating an exemplary embodiment of an electronic device system.

Referring to FIG. 1, an electronic device 1000 accommodates a main board 1010. Chip-related components 1020, network-related components 1030, and other components 1040 may be physically and/or electrically connected to the main board 1010. These components may be coupled to other components, which will be described later, to form various signal lines 1090.

As the chip-related component 1020, a memory chip such as a volatile memory (for example, a dynamic random access memory (DRAM)), a nonvolatile memory (for example, a read only memory (ROM)), a flash memory or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as analog-digital converter, an application-specific integrated circuit (ASIC) or the like, may be included, but the chip-related component 1020 is not limited thereto. In addition to the above-mentioned components, chip-related components 1020 may also be included in different forms. Further, these components 1020 may be combined with each other.

As the network-related component 1030, any of wireless fidelity (Wi-Fi) (Institute of Electrical and Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general package radio service (GPRS), code division multiple access (CDMA), time division multiple access (TDMA), digital cordless telephone (DECT), Bluetooth, 3G, 4G, 5G protocols, and any other wireless and wired protocols designated after the above-mentioned protocols may be included, but the network-related component 1030 is not limited thereto. In addition to the above-mentioned components, any one of various other wireless or wired standards or protocols may also be included. Further, these network-related components 1030 may be combined with the chip-related components 1020 described above.

Other components 1040 may include a high-frequency inductor, a ferrite inductor, a power inductor, ferrite beads, low-temperature co-fired ceramics (LTCC), an electromagnetic interference (EMI) filter, a multilayer ceramic capacitor (MLCC), or the like, but are not limited thereto. In addition to the above-mentioned components, other passive elements used for various purposes may be included. Further, these components 1040 may be combined with the above-mentioned chip-related components 1020 and/or the above-mentioned network-related components 1030.

The electronic device 1000 may include another component which may or may not be physically and/or electrically connected to the main board 1010 depending on the type of electronic device 1000. Examples of other components that may be included in the electronic device 1000 are a camera module 1050, an antenna 1060, a display 1070, a battery 1080, an audio codec (not shown), a video codec (not shown), a power amplifier (not shown), a compass (not shown), an accelerometer (not shown), a gyroscope (not shown), a speaker (not shown), a mass storage device (for example, a hard disk drive) (not shown), a compact disk ((CD), not shown), a digital versatile disk ((DVD), not shown), and the like, but are not limited thereto. In addition to the above-mentioned components, other components used for various purposes may be included, depending on the type of electronic device 1000.

The electronic device 1000 may be a smartphone, a personal digital assistant, a digital video camera, a digital still camera, a network system, a computer, a monitor, a tablet computer, a laptop computer, a netbook computer, a television, a video game console, a smartwatch, or the like. However, the electronic device 1000 is not limited thereto and may be any other electronic device processing data as well as the above-mentioned electronic devices.

Figure 2:
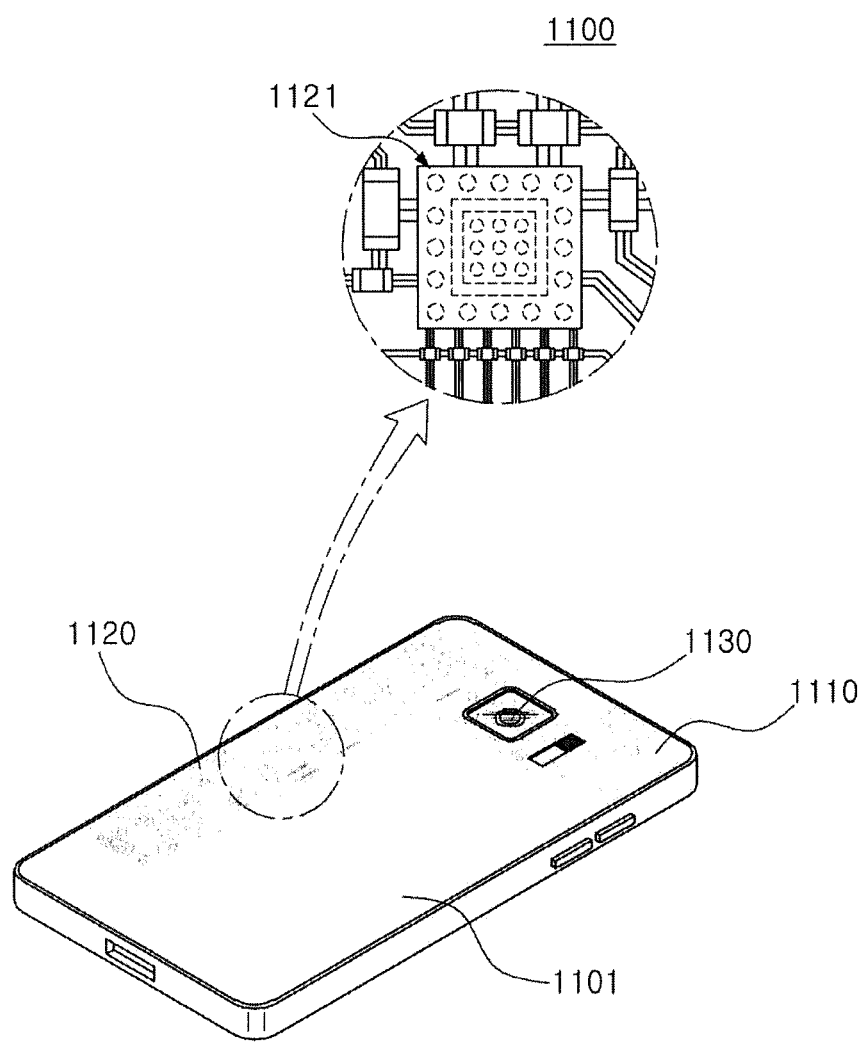
FIG. 2 is a perspective view illustrating an exemplary embodiment of an electronic device system.

FIG. 2 is a perspective view illustrating an exemplary embodiment of an electronic device system.

Referring to FIG. 2, a semiconductor package including an organic interposer may be applied to various electronic devices for various purposes, as mentioned above. For example, a printed circuit board (PCB) 1110 such as a main board may be embedded in a body 1101 of a smartphone 1100, and various components 1120 may be physically and/or electrically connected to the PCB 1110. Other components such as a camera module 1130, and the like, which may be physically and/or electrically connected or not connected to the PCB 1110 are embedded in the body 1101. Some of the components 1120 may be chip-related components, and others maybe an interposer package 1121. The electronic device is not limited to the smartphone 1100 and may be another electronic device.

Semiconductor Package including Interposer

In general, a semiconductor chip includes a large number of microelectric circuits integrated therein. However, the semiconductor chip itself cannot function as a semiconductor finished product and may be damaged by external physical or chemical impacts. Accordingly, the semiconductor chip itself is not used as it is and is packaged to be used in an electronic device or the like, while being packaged.

In terms of electrical connectivity, semiconductor packaging is needed because there is a great difference in circuit width between a semiconductor chip and an electronic device. Specifically, in the case of a semiconductor chip, a size of a connection pad and a distance between connection pads are very small. Meanwhile, in the case of a main board used in an electronic device, a size of a component mounting pad and a distance of component mounting pads are much greater than on a semiconductor chip. Accordingly, there is difficulty in directly mounting a semiconductor chip on a board and there is a need for a packaging technology capable of buffering a difference in circuit width.

A semiconductor package including an interposer fabricated by such a packaging technology will be described hereinafter in detail with reference to accompanying drawings.

Figure 3:
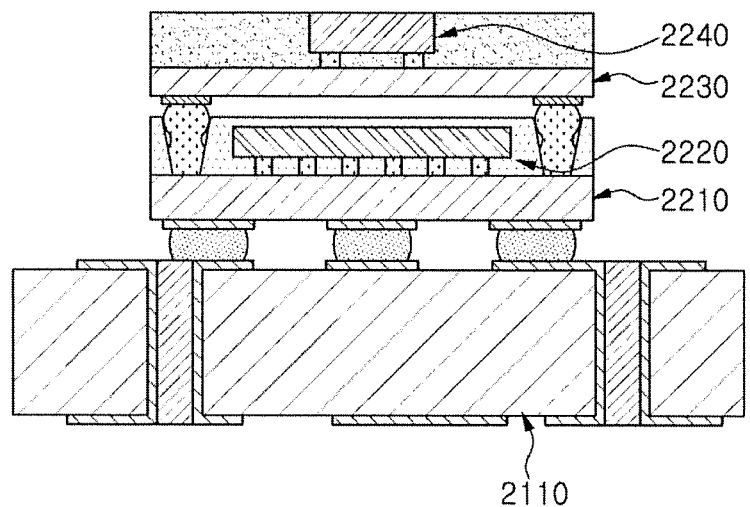
FIG. 3 is a cross-sectional view illustrating a case in which a 3D BGA package is mounted on a main board of an electronic device.

FIG. 3 is a cross-sectional view illustrating a case in which a 3D BGA package is mounted on a main board of an electronic device.

It is very important to package an application specific integrated circuit (ASIC) such as a graphics processing unit (GPU), among semiconductor chips, with high yield, because the price per chip may be significantly high. For this purpose, a ball grid array (BGA) substrate 2210 capable of rewiring several thousands to several hundreds of thousands of connection pads is prepared first, before mounting a semiconductor chip. The same relatively expensive semiconductor chip, such as that of the GPU 2220 is subsequently packaged after being mounted on the BGA substrate 2210 using surface mounting technology (SMT) or the like. Ultimately, the resulting structure is mounted on the main board 2110.

The GPU 2220 is required to significantly reduce a signal path to a memory such as a high bandwidth memory (HBM). To this end, a semiconductor chip such as the GPU 2220 is packaged after being mounted on the interposer 2230. The resulting structure is laminated on a package, on which the GPU 2220 is mounted, in a package-on-package (PoP) fashion, which has been used in the art. However, a thickness of the electronic device may increase excessively and there may be a limitation in significantly reducing the signal path.

Figure 4:
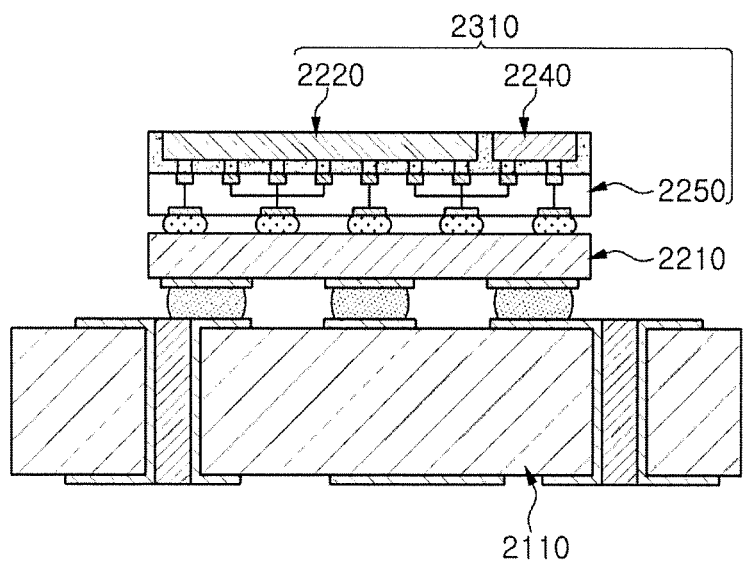
FIG. 4 is a cross-sectional view illustrating a case in which a 2.5D silicon interposer package is mounted on a main board.

FIG. 4 is a cross-sectional view illustrating a case in which a 2.5D silicon interposer package is mounted on a main board.

In view of the foregoing, a semiconductor package 2310 including an organic interposer may be manufactured using 2.5D interposer technology. According to the 2.5D interposer technology, a first semiconductor chip such as GPU 2220 and a second semiconductor chip such as HBM 2240 are packaged after being surface-mounted side by side on a silicon interposer 2250. In this case, the GPU 2220 and the HBM 2240 having several thousands to several hundreds of thousands of connection pads may be rewired through the interposer 2250 and may be electrically connected via a minimum path. If the semiconductor package 2310 including an organic interposer is remounted on a BGA substrate 2210 or the like to be rewired, it may be ultimately mounted on a main board 2110. However, the silicon interposer 2250 is disadvantageous to realizing a large area and low cost because it is very difficult to form a through-silicon via (TSV) and manufacturing cost is very high.

Figure 5:
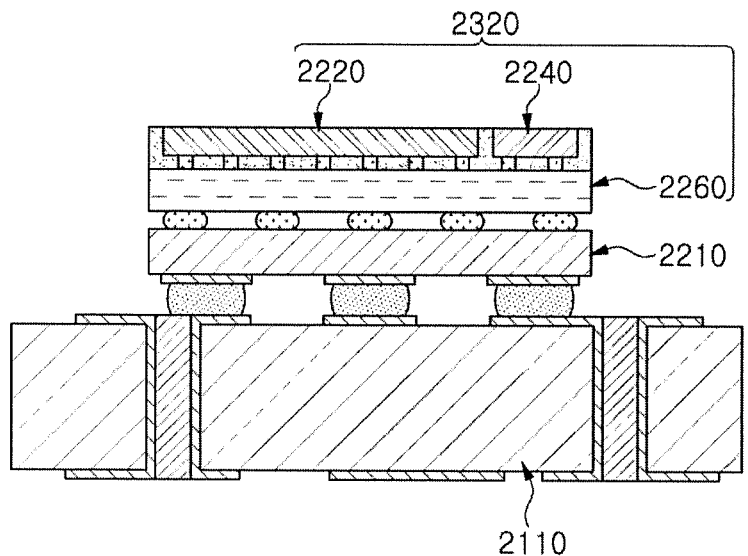
FIG. 5 is a cross-sectional view illustrating a case in which a 2.5D organic interposer package is mounted on a main board.

FIG. 5 is a cross-sectional view illustrating a case in which a 2.5D organic interposer package is mounted on a main board.

In view of the foregoing, an organic interposer 2260 may be used instead of the silicon interposer 2250. For example, a semiconductor package 2320 including an organic interposer may be manufactured using 2.5D interposer technology. According to the 2.5D interposer technology, a first semiconductor chip such as GPU 2220 and a second semiconductor chip such as HBM 2240 may be packaged after being surface-mounted side by side on an organic interposer 2260. In this case, the GPU 2220 and the HBM 2240 having several thousands to several hundreds of thousands of connection pads may be rewired through the interposer 2260 and may be electrically connected via a minimum path. If the semiconductor package 2320 including an organic interposer is mounted again on a BGA substrate 2210 or the like to be rewired, it may ultimately be mounted on a main board 2110. Moreover, the organic interposer 2260 is advantageous to large area and low cost.

The semiconductor package 2320 including an organic interposer is manufactured through a package process in which the chips 2220 and 2240 are molded after being mounted on the interposer 2260. Since the chips 2220 and 2240 are not handled without the molding, they may not be connected to the BGA substrate 2210 or the like. Accordingly, the chips 2220 and 2240 remain rigid through the molding. However, the molding may result in a mismatch of coefficients of thermal expansion (CTE) of the interposer 2260 and the chips 2220 and 2240 with a molding material, as described above. The mismatch of CTE may causes various problems such as warpage, degradation of underfill resin filling properties, cracking between a die and the molding material, and the like.

Figure 6:
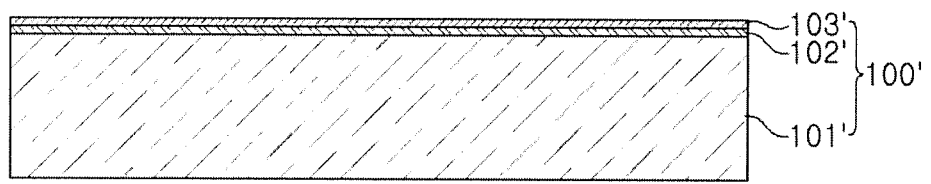
FIGS. 6 to 8 are process diagrams illustrating an exemplary embodiment of a method of manufacturing an organic interposer package.
Figure 6:
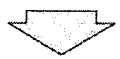
Figure 6:
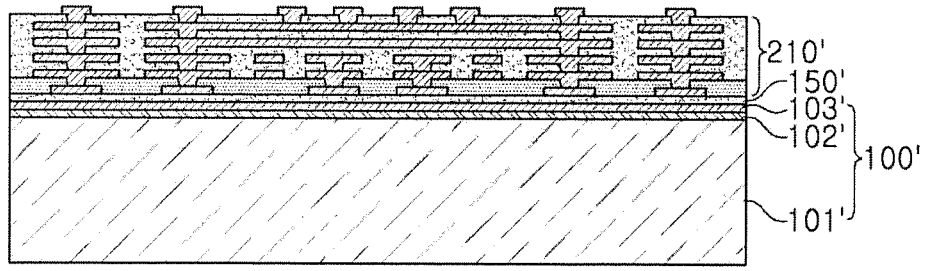
Figure 7:
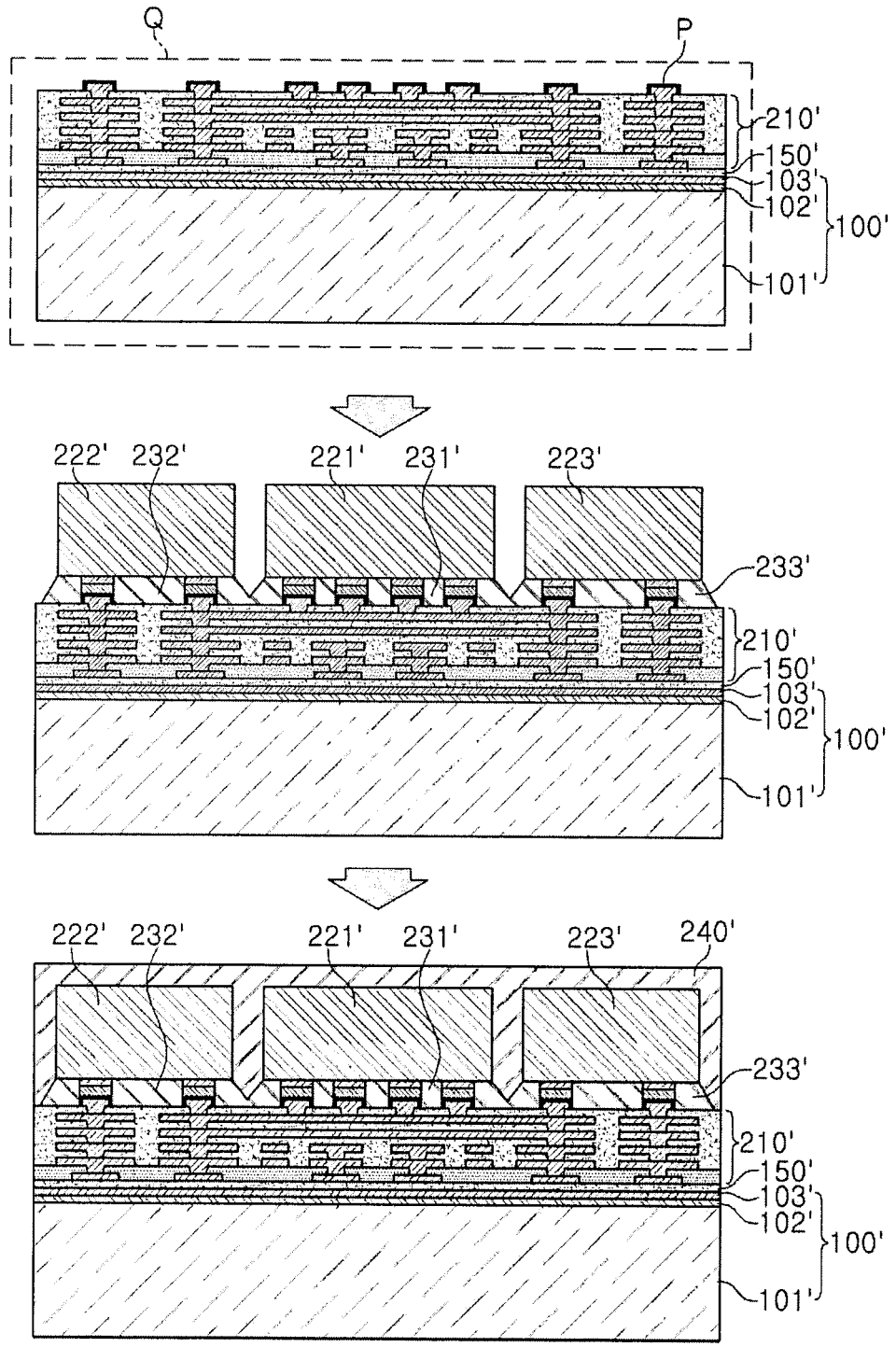
Figure 8:
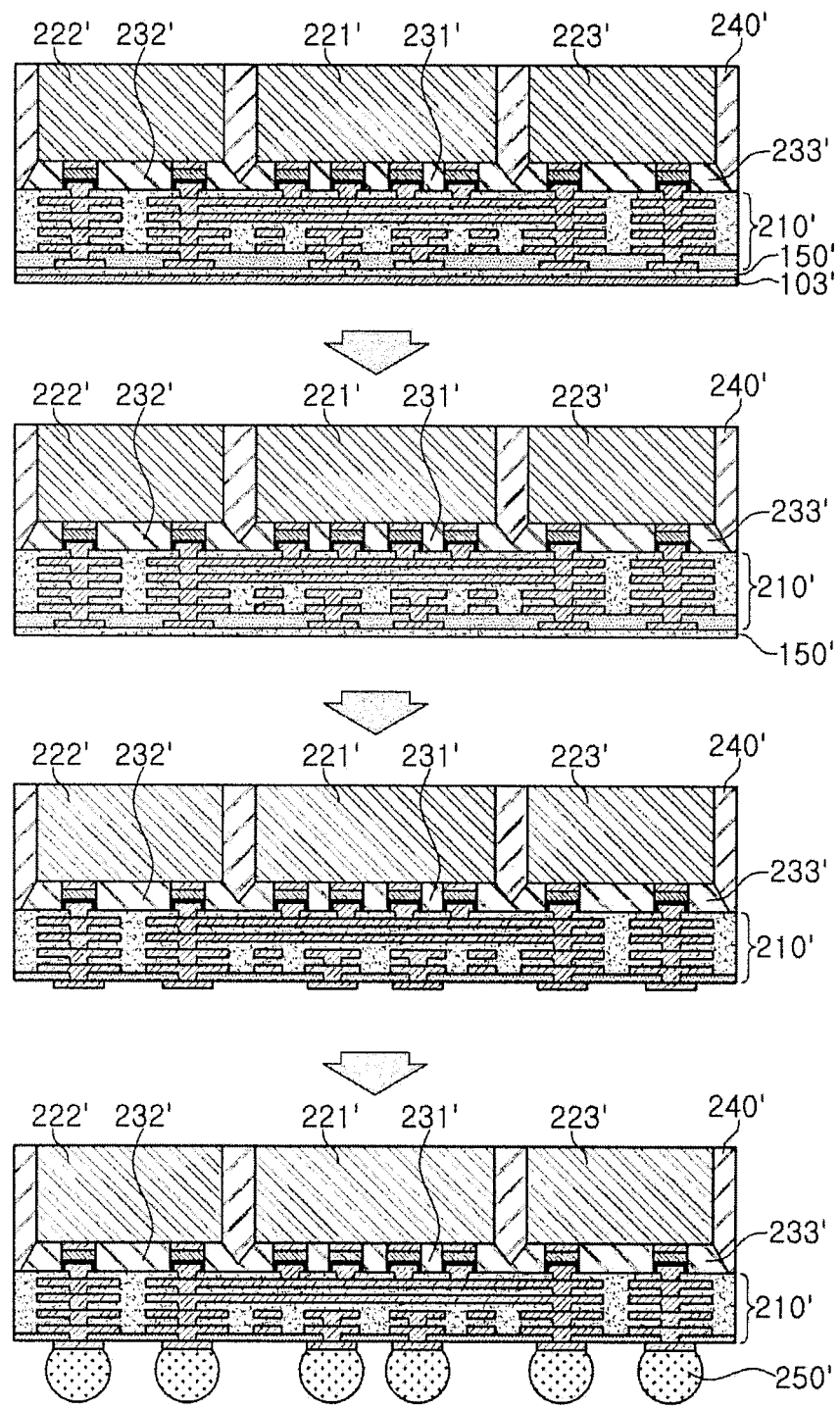

FIGS. 6 to 8 are process diagrams illustrating an exemplary embodiment of manufacturing an organic interposer package.

Referring to FIG. 6, a carrier 100' is prepared. The carrier 100' includes a core layer 101' and metal layers 102' and 103' disposed on the core layer 101'. The core layer 101' may be, for example, a prepreg containing an insulating resin, an inorganic filler, or a glass fiber, but is not limited thereto and may be a glass. Each of the metal layers 102' and 103' may contain a metal such as copper (Cu), titanium (Ti) or the like. A surface treatment may be performed between the metal layers 102' and 103' to facilitate separation of the metal layers 102' and 103'. Alternatively, an adhesive layer (not shown) may be provided between the metal layers 102' and 103'. An organic interposer 210' may be formed on the carrier 100'. The organic interposer 210' may be formed by forming an insulating layer such as an Ajinomoto build-up film (ABF) or a photo imageable dielectric (PID) and forming a wiring layer and a via using a plating technique. The wiring layer of the organic interposer 210' may be formed of a fine circuit. If necessary, a resin layer 150' may be formed between the carrier 100' and the interposer 210'. The resin layer 150' may serve to achieve electrical insulation between the carrier 100' and the interposer 210'. For example, the resin layer 150' maybe used for insulation from the carrier 100' when the wiring layer of the interposer 210' is subjected to an electrical test. The resin layer 150' may be formed by film-form lamination or liquid-form applying and curing. The resin layer 150' may be ABF, PID or the like but is not limited thereto.

Referring to FIG. 7, a surface treatment layer P or the like is formed on a surface of an uppermost wiring layer of the interposer 210'. An electrical test is performed on the wiring layer during a quad route test. Although not shown in the drawing, a panel may be cut (Q) to have a quad size to obtain a number of quad units. If the carrier 100' is not provided with a separation prevention design, the metal layers 102' and 103' may be separated during such a quad sowing process Q. Semiconductor chips 221', 222', and 223' are mounted using a connection member including a low-melting point metal such as tin (Sn). The semiconductor chips 221' 222', and 223' are fixed with underfill resins 231', 232', and 233'. An encapsulant 240' is formed on the interposer 210' to encapsulate the semiconductor chips 221', 222', and 223'. The encapsulant 240' may be formed by film-form lamination or liquid-form applying and curing. Although not shown in detail in the drawing, following formation of the encapsulant 240', a package size trimming process is performed to obtain a plurality of semiconductor packages.

Referring to FIG. 8, the encapsulant 240' is ground to expose inactive surfaces of the semiconductor chips 221', 222', and 223'. Top surfaces of the semiconductor chips 221', 222', and 223' maybe located on the same level by the grinding. For example, the semiconductor chips 221', 222', and 223' may have substantially the same thickness. The carrier 100' is separated. The separation of the carrier 100' may be done by separating the metal layers 102' and 103'. At this point, the remaining metal layer 103' is removed by an etching process. After the carrier 100' is separated, the resin layer 150' is removed by a grinding process or the like, if necessary. An electrical connection structure 250' is attached, and a reflow process or the like is then performed. Through the above-described series of processes, a plurality of semiconductor packages including an organic interposer maybe manufactured.

Carrier Substrate

Hereinafter, a novel carrier substrate with a separation prevention design used to manufacture a package substrate including the above-described organic interposer will be described with reference to accompanying drawings.

Figure 9:
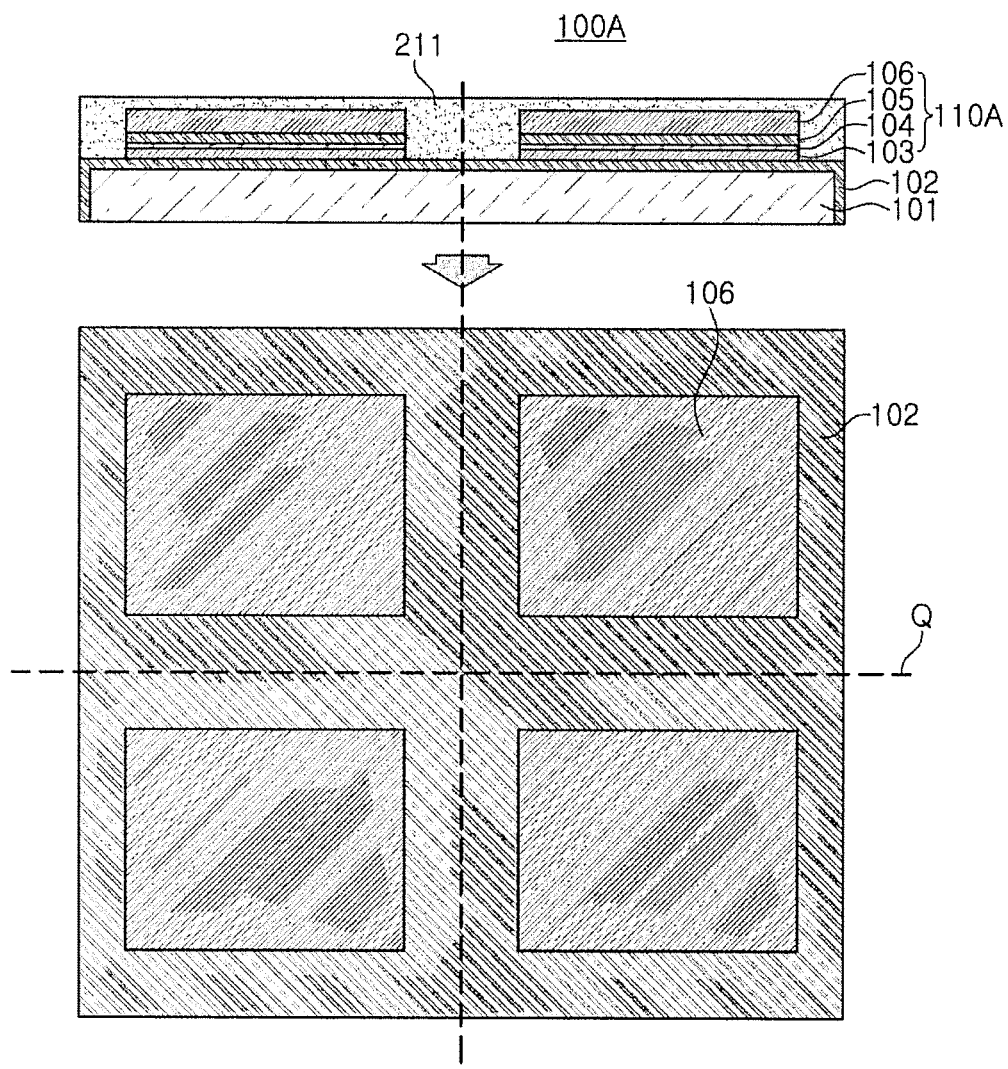
FIG. 9 is a cross-sectional view and a plan view illustrating an exemplary embodiment of a carrier substrate.

FIG. 9 is a cross-sectional view and a plan view illustrating an exemplary embodiment of a carrier substrate 100A.

In the plan view of FIG. 9, an insulating layer 211 is omitted.

Referring to FIG. 9, a carrier substrate 100A according to an example includes a core layer 101, a first metal layer 102 disposed on the core layer 101, a second metal layer 103 disposed on the first metal layer 102, a third metal layer 105 disposed on a release layer 104 disposed on the second metal layer 103, and a fourth metal layer 106 disposed on the third metal layer 105. The first metal layer 102 has a larger area than the core layer 101. The first metal layer 102 covers a top surface and side surfaces of the core layer 101. The second metal layer 103, the release layer 104, the third metal layer 105, and the fourth metal layer 106 are patterned on the first metal layer 102 to constitute a plurality of unit pattern portions 110A in quad units. The number of unit pattern portions 110A is not limited to a specific number, and the patterned shape may be different from that shown in the drawing. Each of the unit pattern portions 110A has a smaller area than the core layer 101 and the first metal layer 102. The unit pattern portions 110A are patterned to be physically spaced apart from each other at regular intervals. Due to the above-described separation prevention design through the unit pattern portions 110A, the release layer 104 may be prevented from being separated from the second metal layer 103 and/or the third metal layer 105 even when a cutting process (Q) is performed on the carrier substrate 100A in quad or strip units.

In detail, a glass plate having an excellent flatness is used as the core layer 101, as will be described later. Since the glass plate has lower adhesion to an insulating material, for example, photo imageable dielectric (PID) than a metal layer, delamination may occur when an insulating layer 211 is disposed adjacent to the core layer 101. The carrier substrate 100A is patterned in such a manner that a layer exposed from the plurality of unit pattern portions 110A is not the core layer 101 but the first metal layer 102. When an insulating layer 211 is additionally formed on the carrier substrate 100A, the insulating layer 211 is disposed adjacent to the first metal layer 102 rather than the core layer 101. As a result, adhesion is improved to prevent delamination. In detail, the first metal layer 102 is a titanium (Ti) layer, as will be described later. The titanium (Ti) layer has better adhesion to PID than a glass plate or a copper (Cu) layer to prevent the delamination more effectively. Moreover, the titanium (Ti) layer is easier to recognize than the glass plate or the copper (Cu) layer in various types of equipment for a package manufacturing process. Accordingly, in the case that a layer exposed from the plurality of unit pattern portions 110A is formed of the first metal layer 102, an aligning mark is formed in a portion of the exposed first metal layer 102 to improve alignment in the package manufacturing process.

In detail, the core layer 101 includes a material having a better flatness than a prepreg. For example, the core layer 101 may be a glass plate. The glass plate may have significantly better flatness than a prepreg. The glass plate refers to an amorphous solid. For example, a glass of the glass plate refers to a material having high transparency formed by melting silica, sodium carbonate, calcium carbonate or the like at a high temperature and cooling the melted material and is conceptually different from an insulating material in which a glass fiber or an inorganic filler is contained in an insulating resin. The glass of the glass plate may be a silicate glass such as sodium lime glass, potassium lime glass, lead glass, barium glass, silicate glass or the like, a borosilicate glass such as pyrex, alumina glass or the like, or a phosphate glass, but is not limited thereto. For example, the glass of the glass plate may include a silicate component. Silicate includes a combination of silica ($SiO_2$) and a metal oxide such as boron oxide, sodium oxide, aluminum oxide, barium oxide, lithium oxide, calcium oxide, zirconium oxide or the like. As an example, the glass plate may includes a silicate component in which silica ($SiO_2$) is bonded to at least one metal oxide such as boron oxide ($B_2O_3$), sodium oxide ($Na_2O$), aluminum oxide ($Al_2O_3$), barium oxide (BaO) lithium oxide ($Li_2O$), calcium oxide (CaO), and zirconium oxide ($ZrO_2$), but is not limited thereto. The core layer 101 may have a thickness of 0.8 mm to 1.2 mm.

The first metal layer 102 may include a sputtered metal. In detail, the first metal layer 102 is a titanium (Ti) layer, but is not limited thereto. The first metal layer 102 may include a publicly known metal having characteristics similar to those of titanium (Ti) or may further include the publicly known metal. The first metal layer 102 may have a thickness of about 0.08 μm to about 0.12 μm.

The second metal layer 103 may also include a sputter metal. In detail, the second metal layer 103 is a copper (Cu) layer, but is not limited thereto. The second metal layer 103 may include a publicly known metal having characteristics similar to those of copper (Cu) or may further include the publicly known metal. The second metal layer 103 may also have a thickness of about 0.08 μm to about 0.12 μm.

In detail, the release layer 104 is an inorganic release layer to introduce stable detachable characteristics. For example, the release layer 104 may include carbon, but is not limited thereto. As described above, the carrier substrate 100A is provided with the separation prevention design through the unit pattern portion 110A to prevent the release layer 104 from being separated while the carrier substrate 100A is cut into quad or strip units. The release layer 104 maybe thinner than other layers 101, 102, 103, 105, and 106 and may have a thickness of, for example, about 0.002 μm to 0.004 μm.

The third metal layer 105 may also include a sputter metal. The third metal layer 105 is preferably a titanium (Ti) layer, but is not limited thereto. The third metal layer 105 may include a publicly known metal having characteristics similar to those of titanium (Ti) or may further include the publicly known metal. The third metal layer 105 may also have a thickness of about 0.08 μm to about 0.12 μm.

The fourth metal layer 106 may also include a sputter metal. The second metal layer 103 is preferably a copper (Cu) layer, but is not limited thereto. The fourth metal layer 106 may include a publicly known metal having characteristics similar to those of copper (Cu) or may further include the publicly known metal. The fourth metal layer 106 may also have a thickness of about 0.28 μm to about 0.32 μm. For example, copper (Cu) of the fourth metal layer 106 may have a greater thickness than copper (Cu) of the second metal layer 103 to secure effective detachable characteristics and flatness.

The insulating layer 211 may be an additional configuration from the viewpoint of the carrier substrate 100A and may be used as a base insulating layer when the interposer 210 to be described later is formed using the carrier substrate 100A. The insulating layer 211 may include an insulating material and, in particular, may include a photo imageable dielectric (PID). The insulating layer 211 is disposed on the first metal layer 102 to cover the plurality of unit pattern portions 110A. The insulating layer 211 may be brought into physical contact with the first metal layer 102 and the unit pattern portion 110A but may not be brought into contact with the core layer 101.

Figure 10:
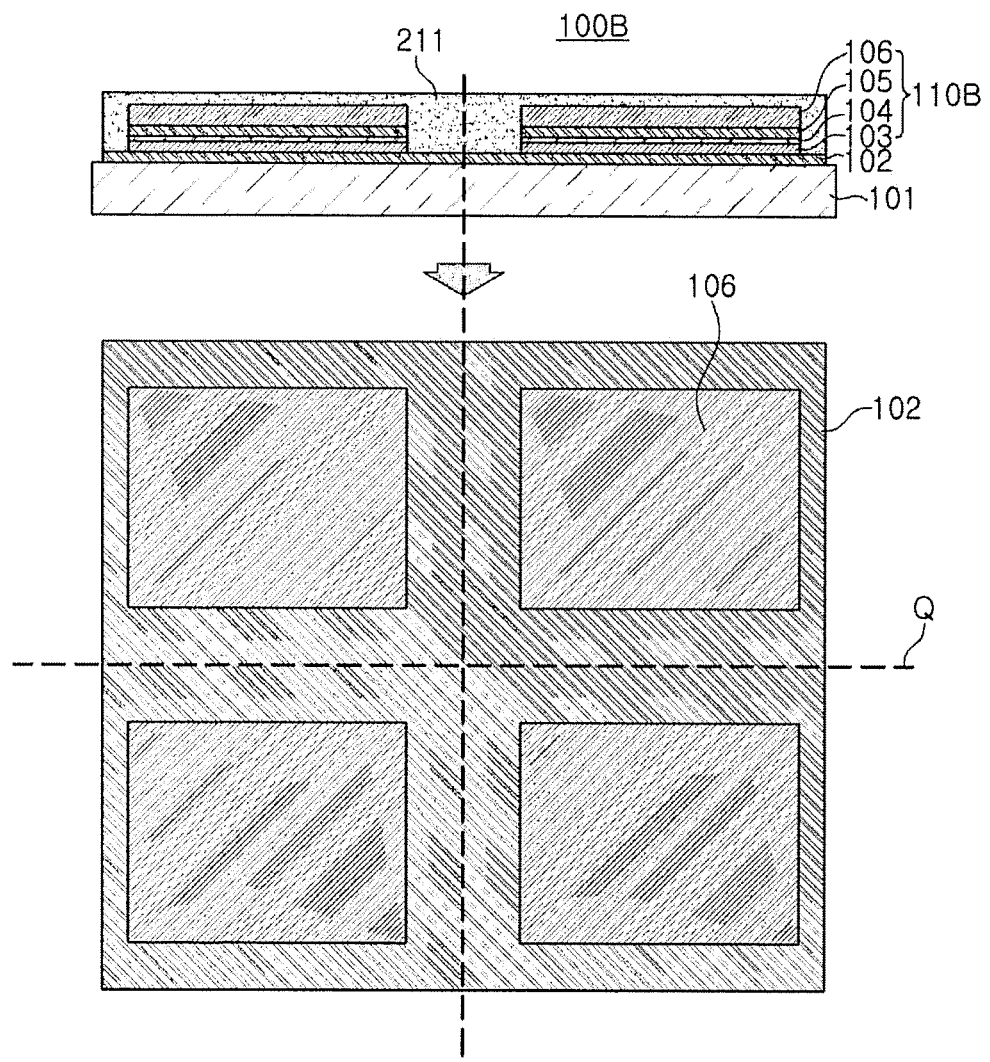
FIG. 10 is a cross-sectional view and a plan view illustrating another exemplary embodiment of a carrier substrate.

FIG. 10 is a cross-sectional view and a plan view illustrating another exemplary embodiment of a carrier substrate.

In the plan view of FIG. 10, an insulating layer 211 is omitted.

Referring to FIG. 10, in a carrier substrate 100B according to another example, a first metal layer 102 has a smaller area than a core layer 101. An outer portion of the core layer 101, for example, an upper surface edge and a side surface of the core layer 101 may be exposed from the first metal layer 102. Likewise, if a metal layer is removed in the outer portion of the core layer 101, an arc fault may be prevented from occurring during a sputtering process. The other explanations are the same as described above. For example, the carrier substrate 100B is also provided with a separation prevention design through a unit pattern portion 110B to prevent a release layer 104 from being separated from a second metal layer 103 and/or a third metal layer 105 even when cutting (Q) is performed in quad or strip units. Patterning is performed in such a manner that a layer exposed first, from a plurality of unit patterns 110B, is not the core layer 101, but the first metal layer 102. Accordingly, when an insulating layer 211 is additionally formed on the carrier substrate 100B, the insulating layer 211 is brought into contact with the first metal layer 102 rather than the core layer 101. As a result, an adhesion may be improved to prevent delamination. Similarly, the first metal layer 102 is preferably a titanium (Ti) layer, and thus the delamination may be prevented more effectively. Moreover, an aligning mark may be formed in a portion of the first metal layer 102 to improve alignment in a package manufacturing process.

Figure 11:
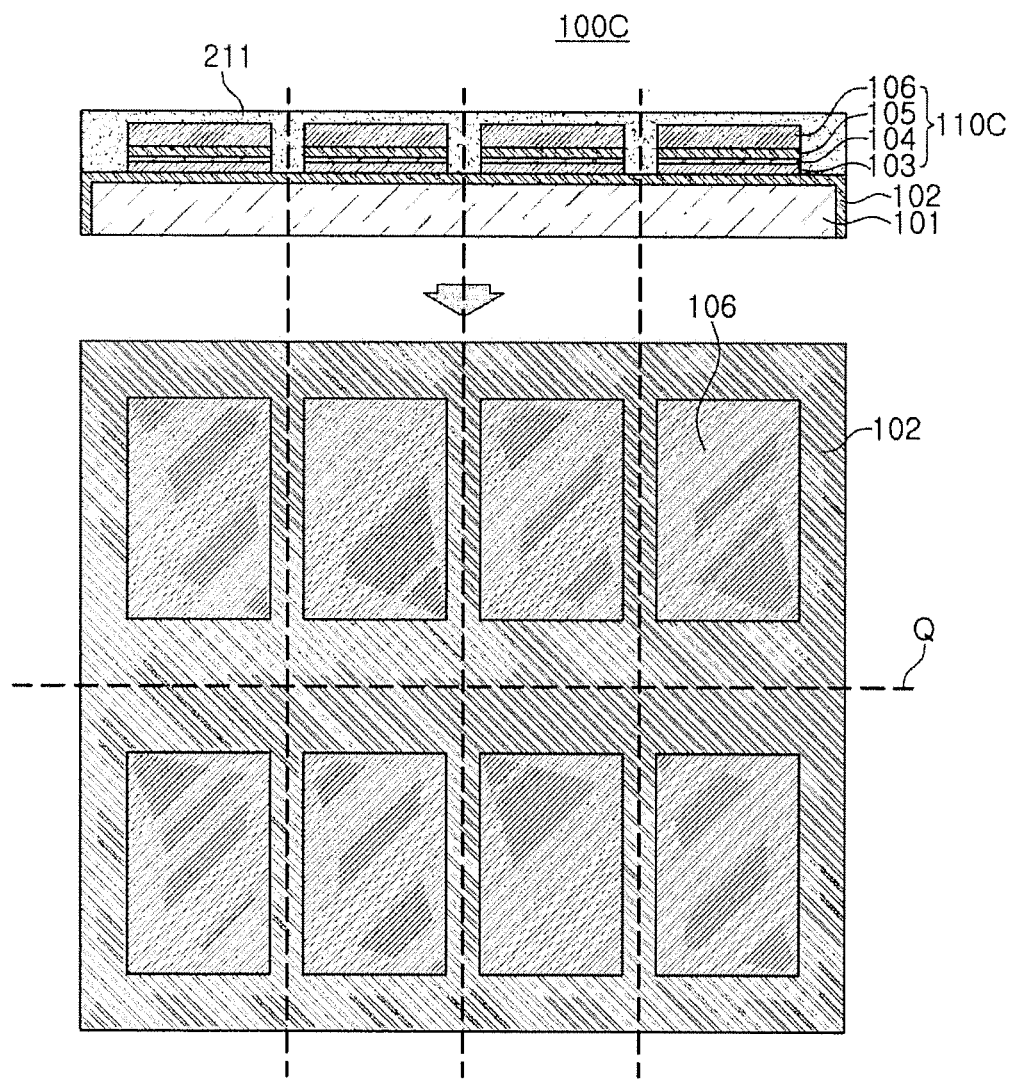
FIG. 11 is a cross-sectional view and a plan view illustrating another exemplary embodiment of a carrier substrate.

FIG. 11 is a cross-sectional view and a plan view illustrating another exemplary embodiment of a carrier substrate.

In the plan view of FIG. 11, an insulating layer 211 is omitted.

Referring to FIG. 11, in a carrier substrate 100C according to another example, unit pattern portions 110C are formed in strip units. The other explanations are the same as described above. That is, the carrier substrate 100C is also provided with a separation prevention design through a unit pattern portion 110C to prevent a release layer 104 from being separated from a second metal layer 103 and/or a third metal layer 105 even when cutting (Q) is performed in quad or strip units. Patterning is performed in such a manner that a layer exposed first from a plurality of unit patterns 110C is not the core layer 101 but the first metal layer 102. Accordingly, when an insulating layer 211 is additionally formed on the carrier substrate 100C, the insulating layer 211 is brought into contact with the first metal layer 102 rather than the core layer 101. As a result, an adhesion may be improved to prevent delamination. Similarly, the first metal layer 102 is preferably a titanium (Ti) layer, and thus the delamination may be prevented more effectively. Moreover, an aligning mark may be formed in a portion of the first metal layer 102 to improve alignment in a package manufacturing process.

Figure 12:
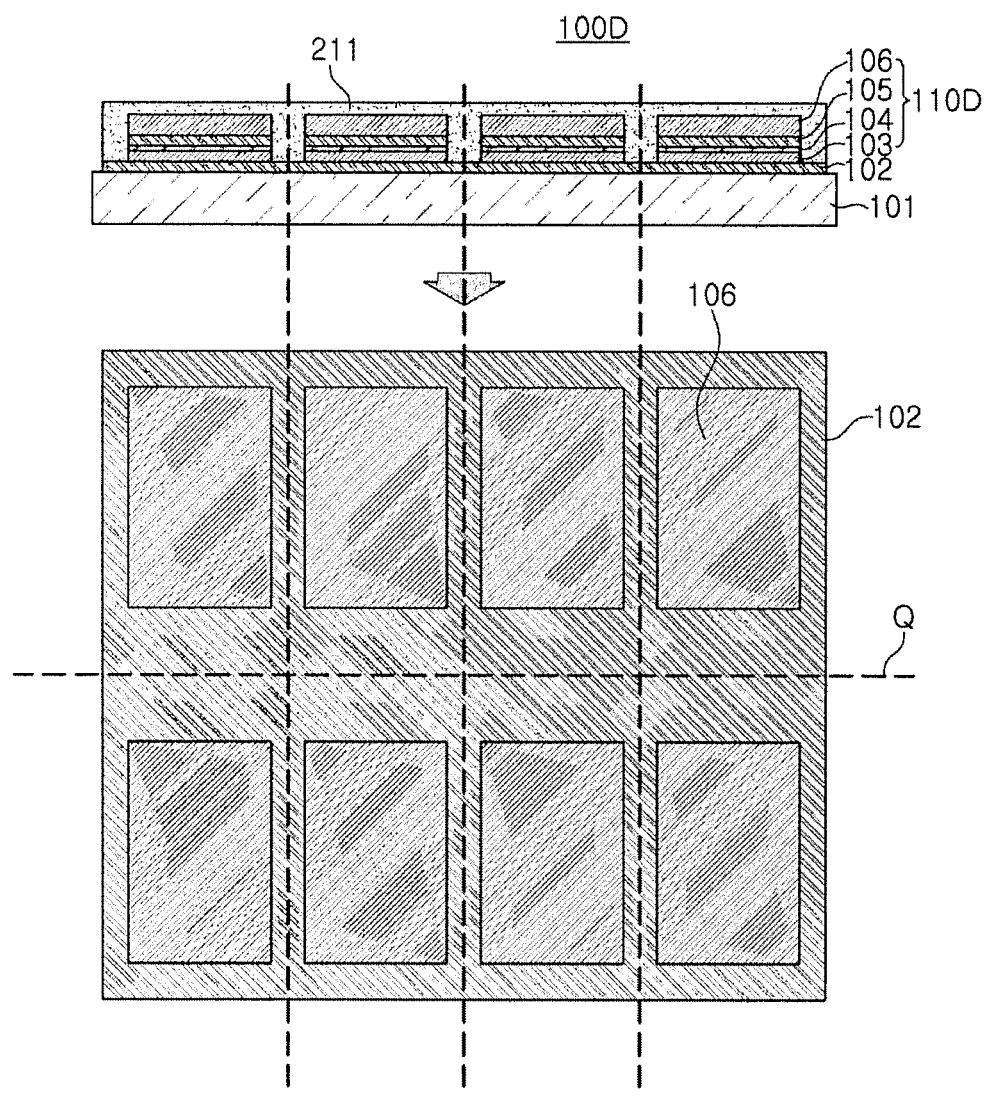
FIG. 12 is a cross-sectional view and a plan view illustrating another exemplary embodiment of a carrier substrate.

FIG. 12 is a cross-sectional view and a plan view illustrating another exemplary embodiment of a carrier substrate.

In the plan view of FIG. 12, an insulating layer 211 is omitted.

Referring to FIG. 12, in a carrier substrate 100D according to another example, unit pattern portions 110D are formed in strip units. The other explanations are the same as described above. That is, in the carrier substrate 100D, an outer portion of the core layer 101, for example, an upper surface edge and a side surface of the core layer 101 may be exposed from the first metal layer 102. Accordingly, an arc fault may be prevented from occurring during a sputtering process. In addition, the carrier substrate 100D is also provided with a separation prevention design through a unit pattern portion 110D to prevent a release layer 104 from being separated from a second metal layer 103 and/or a third metal layer 105 even when cutting (Q) is performed in quad or strip units. Patterning is performed in such a manner that a layer exposed first from a plurality of unit patterns 110C is not the core layer 101 but the first metal layer 102. Accordingly, when an insulating layer 211 is additionally formed on the carrier substrate 100C, the insulating layer 211 is brought into contact with the first metal layer 102 rather than the core layer 101. As a result, an adhesion may be improved to prevent delamination. Similarly, the first metal layer 102 is preferably a titanium (Ti) layer, and thus the delamination may be prevented more effectively. Moreover, an aligning mark may be formed in a portion of the first metal layer 102 to improve alignment in a package manufacturing process.

Figure 13:
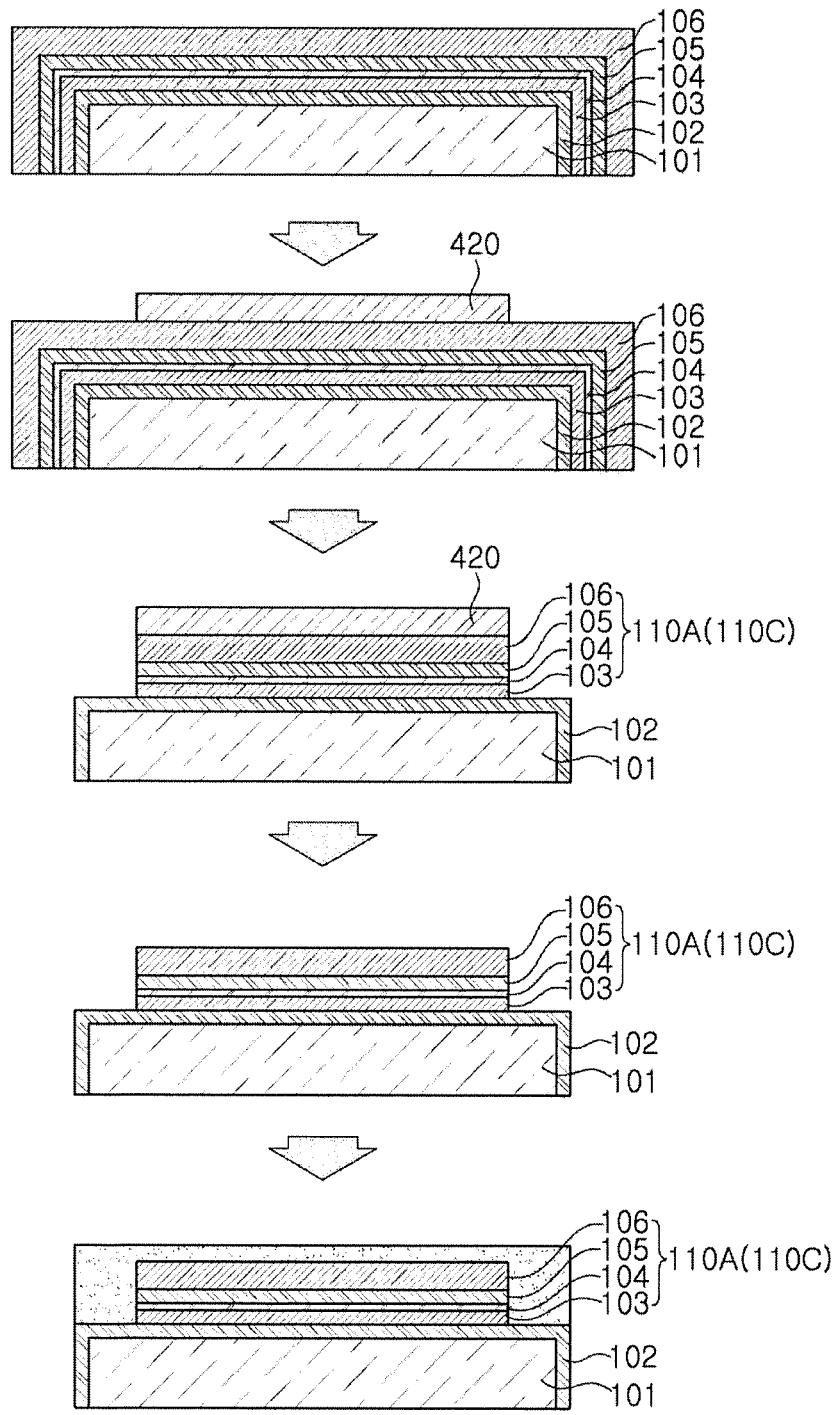
FIG. 13 is a cross-sectional view illustrating an exemplary embodiment of a method of manufacturing a carrier substrate.

FIG. 13 is a process diagram illustrating an exemplary embodiment of a method of manufacturing a carrier substrate.

Referring to FIG. 13, the above-described carrier substrate 100A or 100C may be formed by means of lithography using a photoresist film 420 such as a dry film. For example, first and second metal layers 102 and 103, a release layer 104, and third and fourth metal layers 105 and 106 are formed using a sputter. The photoresist film 420 is attached to the fourth metal 106. After the photoresist film 420 is patterned through exposure and development, except for the first metal layer 102, the second metal layer 103, the release layer 104, the third metal layer 105, and the fourth metal layer 106 are patterned by selective etching to form unit pattern portions 110A or 110C. Ultimately, the photoresist film 420 is stripped. Thus, formation of the above-described carrier substrate 100A or 100C may be completed. If necessary, an insulating layer 211 may be formed on the first metal layer 102 to cover the unit pattern portions 110A or 110C by coating or laminating a photo imageable dielectric (PID). In this case, a wall surface of each unit pattern portion 110A or 110C has an inclined acute angle. That is, each unit pattern portion 110A or 110C has a tapered shape in which a width thereof narrows from a bottom surface to a top surface.

Figure 14:
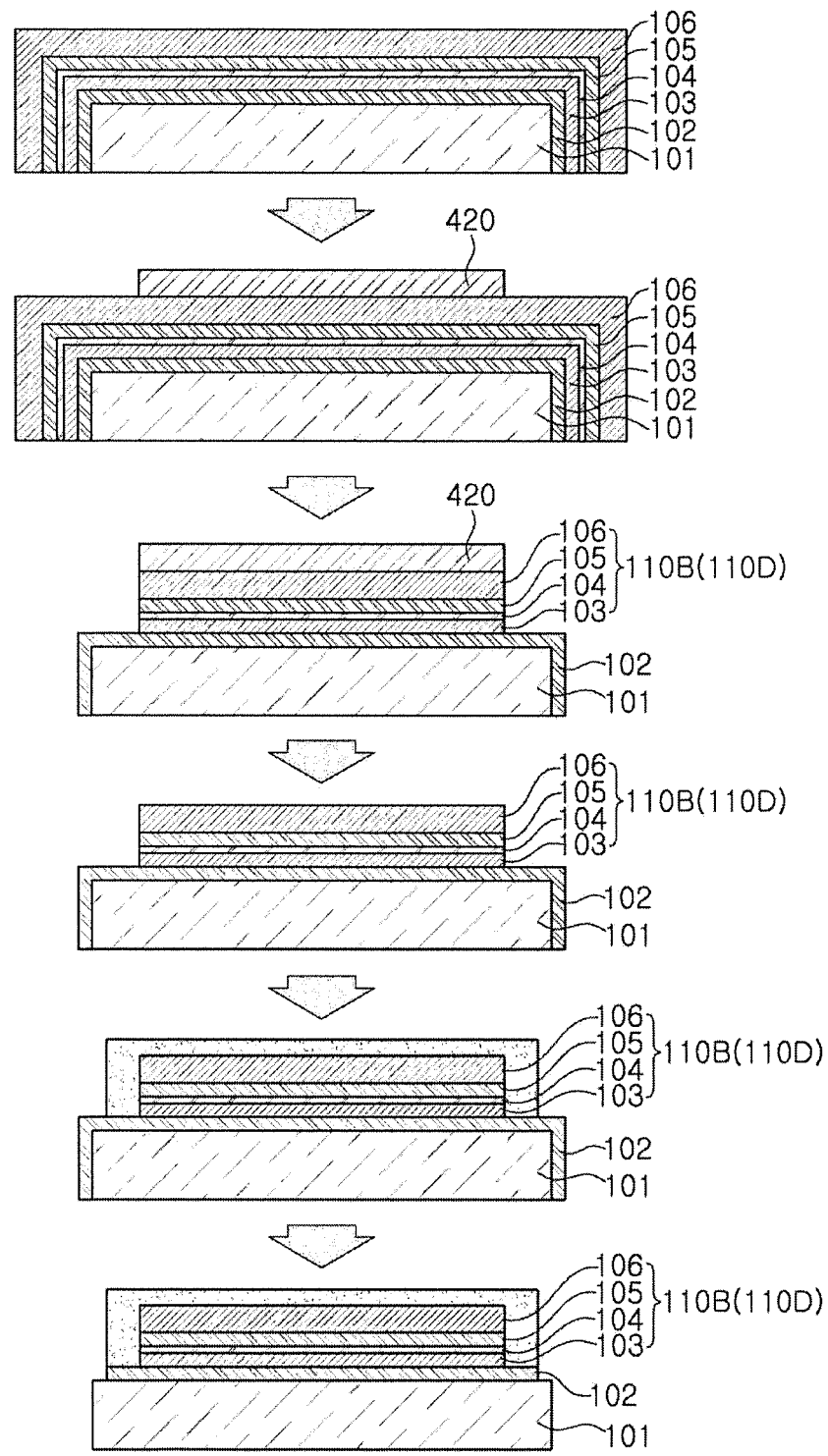
FIG. 14 is a cross-sectional view illustrating another exemplary embodiment of a method of manufacturing a carrier substrate.

FIG. 14 is a process diagram illustrating another exemplary embodiment of a method of manufacturing a carrier substrate.

Referring to FIG. 14, the above-described carrier substrate 100B or 100D may also be formed by means of lithography using a photoresist film 420 such as a dry film. For example, first and second metal layers 102 and 103, a release layer 104, and third and fourth metal layers 105 and 106 are formed using a sputter. The photoresist film 420 is attached to the fourth metal 106. After the photoresist film 420 is patterned through exposure and development, except for the first metal layer 102, the second metal layer 103, the release layer 104, the third metal layer 105, and the fourth metal layer 106 are patterned by selective etching to form unit pattern portions 110B or 110D. The photoresist film 420 is stripped. An insulating layer 211 is formed on the first metal layer 102 to cover the unit pattern portions 110B or 110D by coating or laminating a photo imageable dielectric (PID). The first metal layer 102 is etched to expose an upper surface edge and a side surface of the core layer 101. Thus, formation of the above-described carrier substrate 100B or 100D may be completed. Similarly, a wall surface of each unit pattern portion 110B or 110D has an inclined acute angle. That is, each unit pattern portion 110B or 110D has a tapered shape in which its width narrows from a bottom surface to a top surface.

Figure 15:
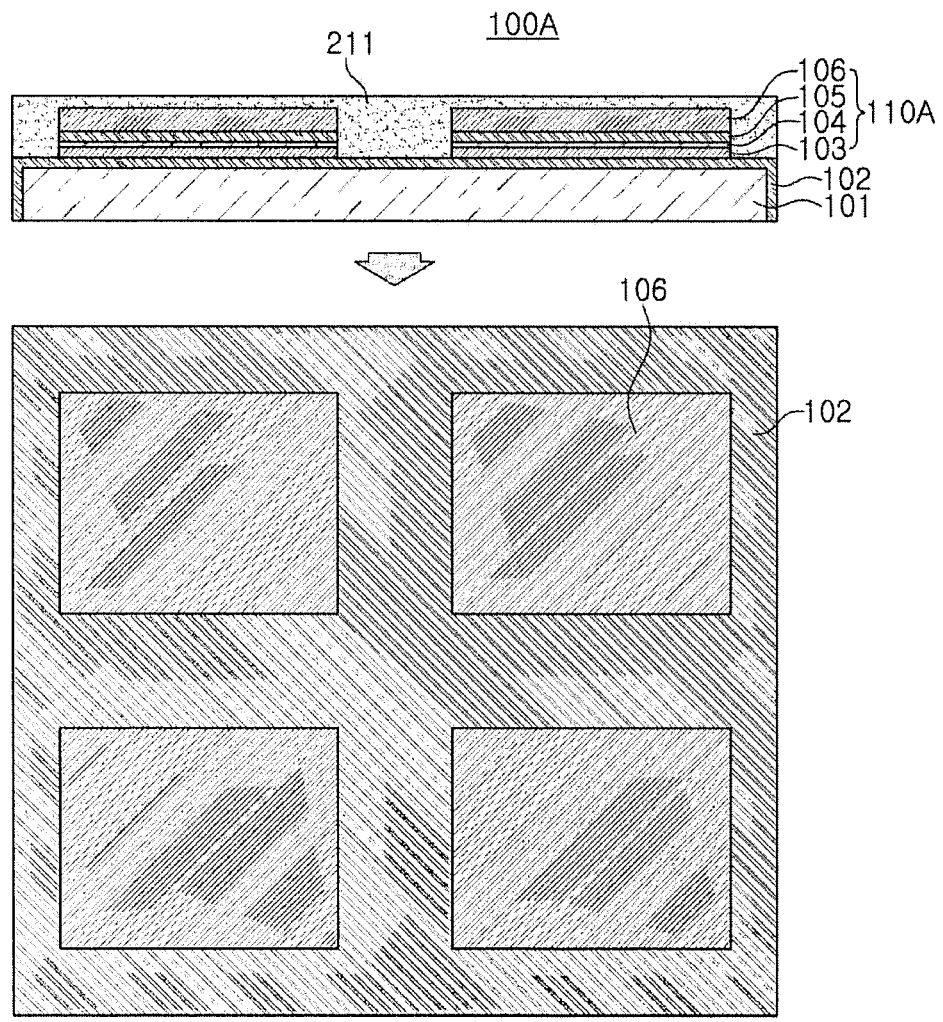
FIGS. 15 to 17 are process diagrams illustrating an exemplary embodiment of a method of manufacturing a semiconductor package using a carrier substrate according to the present disclosure.
Figure 16:
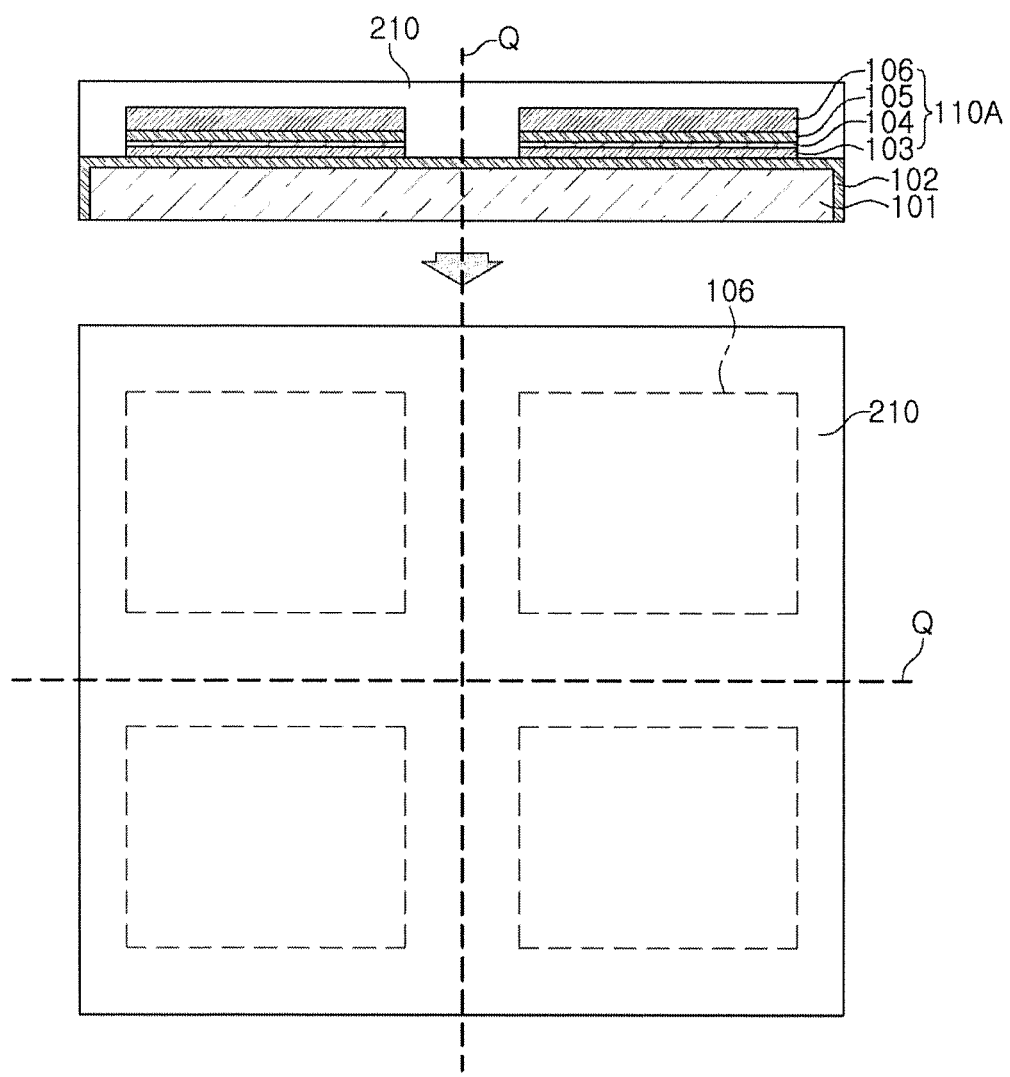
Figure 17:
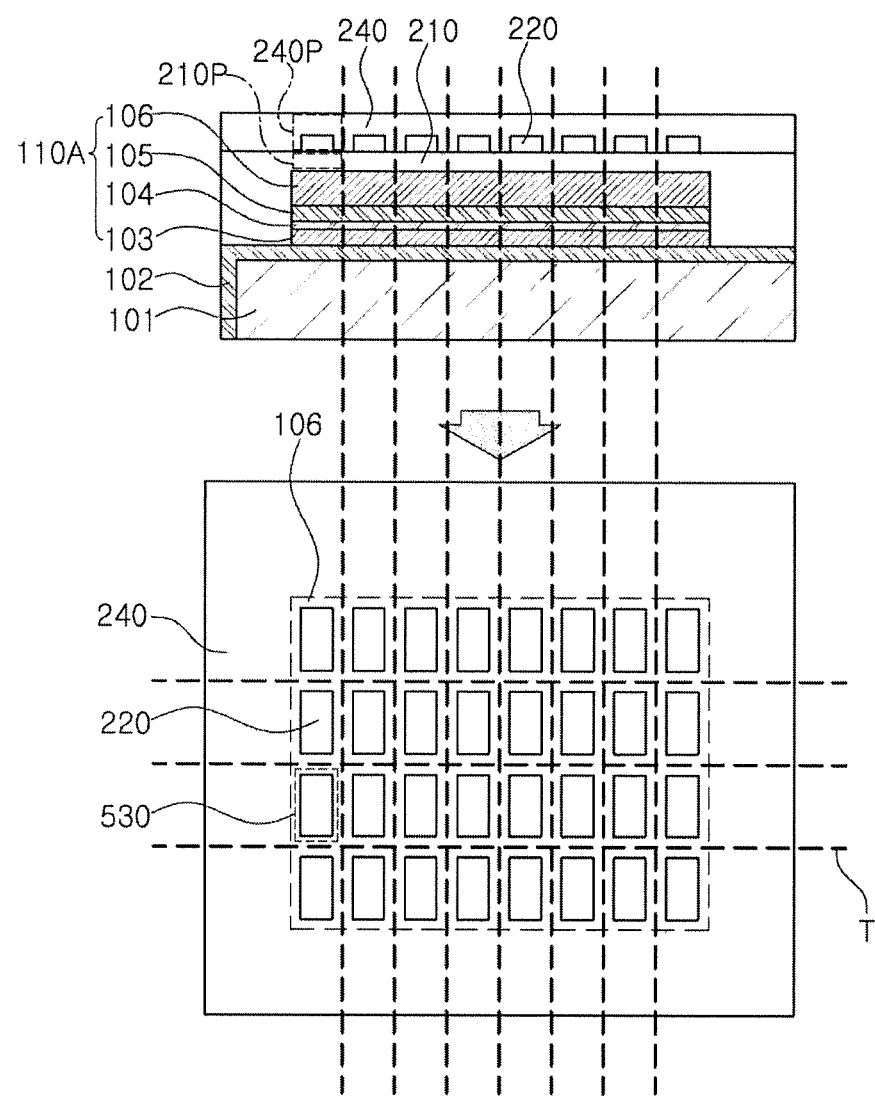

FIGS. 15 to 17 are process diagrams illustrating an exemplary embodiment of a method of manufacturing a semiconductor package using a carrier substrate according to the present disclosure.

Referring to FIG. 15, the above-described carrier substrate 100A is prepared. It is a matter of course that other carrier substrates 1005, 110C, and 100D may also be prepared. In a plan view of FIG. 15, an insulating layer 211 is omitted.

Referring to FIG. 16, an interposer 210 is formed on the respective unit pattern portions 110A. The interposer 210 includes an insulating layer, a wiring layer, and a via. The insulating layer 211 in FIG. 15 may be used as a base insulating layer. After formation of the insulating layer 211, an electrical test is performed on a wiring layer and the like. Cutting Q is performed for cutting from panel size to quad or strip size. The cutting Q is performed by cutting the carrier substrate 100A and the interposer 210 in such a manner the unit pattern portions 110A are disconnected from each other. As mentioned above, the carrier substrate 100A is provided with a separation prevention design to prevent separation of the carrier substrate 100A during the cutting Q.

Referring to FIG. 17, a plurality of semiconductor chips 220 are formed on the interposer 210 on the respective disconnected unit pattern portions 110A. An encapsulant 240 is formed to encapsulate the plurality of semiconductor chips 220 on the interposer 210 on the respective disconnected unit pattern portions 110A. As a result, a plurality of semiconductor packages 530 are formed, including an interposer portion 210P disposed on the respective disconnected unit pattern portions 110A, one or more semiconductor chips 220 disposed on the interposer portion 210P, and an encapsulation portion 240P to encapsulate the one or more semiconductor chips 220. The respective disconnected unit pattern portions 110A are trimmed (T) in such a manner that the plurality of semiconductor packages 530 on the respective disconnected unit pattern portions 110A are disconnected from each other. As shown in FIG. 17, each of the semiconductor packages 530 fabricated after the trimming (T) includes a single semiconductor chip 220. However, it is a matter of course that each of the semiconductor packages 530 may include a plurality of semiconductor chips 220. If the carrier substrate 100A, having been cut (Q) and trimmed (T) is separated from the respective semiconductor packages 530 after the trimming (T), a plurality of semiconductor packages 530 are obtained. The operation of separating the carrier substrate 100A having been cut (Q) and trimmed (T) may be an operation of separating a release layer 104 and a third metal layer 105 of the respective unit pattern portions 100A having been cut (Q) and trimmed (T). After separation of the carrier substrate 100A, metal layers 105 and 106 remaining on the respective semiconductor packages 530 may be removed by an etching process, if necessary.

In the case that a type of detachable glass carrier 100A having a specific pattern portion 100A is used, a fine circuit of the interposer 210 having an excellent flatness may be easily formed and a stable process driving quality may be secured even in a quad-level assembly process without separation of a carrier. Additionally, delamination of an insulating layer 211 for formation of the interposer 210 or an arc fault occurring during a sputtering process may be prevented, and alignment may be improved during a package manufacturing process. Furthermore, cost may be reduced when a glass carrier substrate 100A is fabricated at raw-materials level to have a specific pattern portion 110A. The same effects as described above may be obtained even when the other substrates 100B, 100C, and 100D are used.

In the present disclosure, an upper side, an upper portion, an upper surface, and the like are used to refer to a lamination direction of respective components in relation to cross sections of the drawings, whereas a lower side, a lower portion, a lower surface, and the like are used to refer to a direction opposite to the lamination direction. However, these directions are defined for convenience of description, and the claims are not particularly limited by the directions defined as described above.

The term "area of component" used in the present disclosure refers to the width of an upper surface or a lower surface of each component adjacent to another element in relation to the attached drawings. For example, a planar area of the core layer 101 should be understood as being an area of an upper surface of the core layer 101, a planar area of the first metal layer 102 should be understood as being an area of an upper surface of the first metal layer 102, a planar area of each of the second to fourth metal layers 103, 105, and 106 and the release layer 104 should be understood as being an area of an upper surface and/or a lower surface of each thereof, and the area of a unit pattern portion should be understood as an area of a lowest surface of the unit pattern portion.

In the present disclosure, the meaning of a "connection" of a component to another component in the description includes an indirect connection through an adhesive layer as well as a direct connection between two components. In addition, "electrically connected" encompasses the concepts of a physical connection and a physical disconnection. It can be understood that when an element is referred to using terms such as "first" and "second", the element is not limited thereby. They may be used only for a purpose of distinguishing one element from other elements, and may not limit the sequence or importance of the elements. In some cases, a first element may be referred to as a second element without departing from the scope of the claims set forth herein. Similarly, a second element may also be referred to as a first element.

The term "an exemplary embodiment" used in the present disclosure does not refer to the same exemplary embodiment, and is provided to emphasize a particular feature or characteristic different from that of another exemplary embodiment. However, exemplary embodiments provided herein are considered to be able to be implemented by being combined in whole or in part with one another. For example, one element described in a particular exemplary embodiment, even if it is not described in another exemplary embodiment, may be understood as a description related to another exemplary embodiment, unless an opposite or contradictory description is provided therein. The terms used herein are merely to describe a specific embodiment, and thus the present invention is not limited to them. Further, as far as singular expression clearly denotes a different meaning in context, it includes plural expression.

Terms used herein are used only in order to describe an exemplary embodiment rather than limiting the present disclosure. In this case, singular forms include plural forms unless interpreted otherwise in context.

As described above, a carrier substrate maybe provided which may be configured to secure a stable process driving quality even in a quad-level assembly process without separation of a carrier substrate and to prevent delamination between the carrier and an insulating layer. In addition, a method of manufacturing a semiconductor package including an interposer having a fine circuit, using a carrier substrate, may be also provided.

While exemplary embodiments have been shown and described above, it will be apparent to those skilled in the art that modifications and variations could be made without departing from the scope of the present invention as defined by the appended claims.

What is claimed is:

1. A carrier substrate comprising:
a core layer;
a first metal layer disposed on the core layer; and
a plurality of unit pattern portions disposed on the first metal layer,
wherein
the plurality of unit pattern portions each have a planar area smaller than a planar area of the first metal layer, and
the plurality of unit pattern portions each include a second metal layer disposed on the first metal layer, a release layer disposed on the second metal layer, and a third metal layer disposed on the release layer.

2. The carrier substrate of claim 1, wherein the plurality of unit pattern portions are physically spaced apart from each other by a predetermined interval.

3. The carrier substrate of claim 1, wherein the first metal layer has a planar area larger than a planar area of the core layer.

4. The carrier substrate of claim 3, wherein the first metal layer covers a top surface and a side surface of the core layer.

5. The carrier substrate of claim 1, wherein the first metal layer has a planar area smaller than a planar area of the core layer.

6. The carrier substrate of claim 5, wherein an outer portion of the core layer near edges of an upper surface of the core layer is exposed from the first metal layer.

7. The carrier substrate of claim 5, wherein an outer portion of the core layer near a side surface is exposed from the first metal layer.

8. The carrier substrate of claim 1, wherein the core layer is a glass plate.

9. The carrier substrate of claim 1, wherein each of the plurality of unit pattern portions further comprises a fourth metal layer disposed on the third metal layer.

10. The carrier substrate of claim 9, wherein
the first metal layer comprises a titanium (Ti) layer,
the second metal layer comprises a copper (Cu) layer,
the third metal layer comprises a titanium (Ti) layer, and
the fourth metal layer comprises a copper (Cu) layer.

11. The carrier substrate of claim 10, wherein a thickness of the Cu layer of the fourth metal layer is greater than a thickness of the Cu layer of the second metal layer.

12. The carrier substrate of claim 1, wherein the release layer comprises an inorganic release layer.

13. The carrier substrate of claim 1, further comprising:
an insulating layer disposed on the first metal layer to cover the plurality of unit pattern portions,
wherein the insulating layer is not in contact with the core layer.

14. A method of manufacturing a semiconductor package, the method comprising:
preparing a carrier substrate including a core layer, a first metal layer disposed on the core layer, and a plurality of unit pattern portions disposed on the first metal layer, each of the plurality of unit pattern portions having a planar area smaller than a planar area of the first metal layer, and the plurality of unit pattern portions each including a second metal layer disposed on the first metal layer, a release layer disposed on the second metal layer, and a third metal layer disposed on the release layer;
forming an interposer on the respective unit pattern portions;
cutting the carrier substrate and the interposer to disconnect the respective unit pattern portions from each other;
placing a plurality of semiconductor chips on the interposer on the respective cut unit pattern portions;
forming an encapsulant on the interposer on the respective cut unit pattern portions to form a plurality of semiconductor packages on the respective cut unit pattern portions, the encapsulant encapsulating the semiconductor chips, and the plurality of semiconductor packages each including an interposer portion, one or more semiconductor chips disposed on the interposer portion, and an encapsulation portion disposed to encapsulate the one or more semiconductor chips;
trimming the respective cut unit pattern portions to disconnect the plurality of semiconductor packages on the respective cut unit pattern portions from each other; and
separating the carrier substrate from the respective cut semiconductor packages.

15. The method of claim 14, wherein the separating of the carrier substrate comprises separating a release layer and a third metal layer of the respective cut and trimmed unit pattern portions.

16. The method of claim 15, wherein the respective disconnected and trimmed unit pattern portions remaining on the semiconductor package are removed by an etching process after the separating of the carrier substrate.

17. A carrier substrate comprising:
a core layer;
a first metal layer disposed on the core layer;
a plurality of unit pattern portions, disposed on the first metal layer, comprising at least one metal layer and at least one release layer; and
an insulating layer covering the plurality of unit pattern portions, wherein
the plurality of unit pattern portions each have a planar area smaller than a planar area of the first metal layer, and
the insulating layer is separated from the core layer with the first metal layer.

18. The carrier substrate of claim 17, wherein the first metal layer has a planar area larger than a planar area of the core layer, and
the first metal layer covers a top surface and a side surface of the core layer.

19. The carrier substrate of claim 17, wherein the first metal layer has a planar area smaller than a planar area of the core layer, and
an outer portion of the core layer near edges of an upper surface and an outer portion of the core layer near a side surface of the core layer are exposed from the first metal layer.

20. The carrier substrate of claim 17, wherein the core layer is a glass plate,
the first metal layer comprises a titanium (Ti) layer,
the at least one metal layer comprises a copper (Cu) layer, and
the at least one release layer comprises an inorganic release layer.

* * * * *